United States Patent [19]
Fuller

[11] Patent Number: 5,670,413
[45] Date of Patent: Sep. 23, 1997

[54] METHOD AND APPARATUS FOR RADIATION HARDENED ISOLATION

[75] Inventor: Robert T. Fuller, Melbourne Beach, Fla.

[73] Assignee: Harris Corporation, Palm Bay, Fla.

[21] Appl. No.: 586,556

[22] Filed: Jan. 16, 1996

[51] Int. Cl.$^6$ .................................................. H01L 21/76
[52] U.S. Cl. .............................. 437/69; 437/240; 437/938
[58] Field of Search ................................ 437/69, 70, 72, 437/73, 938, 240

[56] References Cited

U.S. PATENT DOCUMENTS

| | | |
|---|---|---|
| 4,942,449 | 7/1990 | Wei et al. ................................ 437/69 |
| 4,994,407 | 2/1991 | Custode et al. ........................... 437/70 |
| 5,225,358 | 7/1993 | Pasch .................................... 437/72 |
| 5,418,174 | 5/1995 | Kalnitsky ............................... 437/938 |

*Primary Examiner*—Trung Dang
*Attorney, Agent, or Firm*—Thomas R. FitzGerald

[57] ABSTRACT

A radiation hardening isolation technique uses a poly buffered LOCOS structure (34, 36) to protect the device areas during field oxide 40 formation. The field oxide 40 is removed, and the polysilicon structure 34 is covered with a PSG or BPSG layer 42. Layer 42 is planarized and the polysilicon 34 is removed to provide a self-aligned device region 31.

10 Claims, 3 Drawing Sheets

METHOD AND APPARATUS FOR RADIATION HARDENED ISOLATION

BACKGROUND

This invention relates in general to integrated circuits, and in particular, to radiation hardened isolation methods and devices.

Radiation hardened devices require different isolation techniques compared to techniques for isolating devices formed on bulk silicon wafers. With bulk silicon wafers, it is common to isolate adjacent devices using local oxidation of silicon (LOCOS). Standard LOCOS isolation is unacceptable for radiation hardened devices. LOCOS isolation produces a thick field of silicon dioxide. Such thick field oxide traps radiation induced charges.

Charge trapping is prevented by reducing the size of the thick field oxide and using a layer of a radiation hardening dielectric such as phosphosilicate glass (PSG) or borophospho-silicate glass (BPSG). The PSG or BPSG layer is patterned over the device area and removed.

The standard method for isolating radiation hardened devices has several drawbacks. For one, during the LOCOS phase, there is a large encroachment of oxide into the active device area. The encroachment, sometimes known as "bird's beak", may reduce the active area size from the desired size. With standard techniques, the current process may reduce the active area size as much as 1.5 µm on each side of the device area. Such reduction of device area due to encroachment limits the allowable number of devices that can be placed on the substrate. In addition, the standard process requires a further masking step to form an opening in the radiation hardening dielectric in order to expose the device area. It is also difficult to precisely control the removal of the radiation hardening dielectric. Removal may require an initial dry etch followed by a subsequent wet etch. As a result, portions of the device area may be etched or otherwise damaged. Such damage may result in failed devices.

Accordingly, there has been a long felt need for a more efficient and better controlled radiation hardening isolation process and structure. In particular, it would be desirable to have a radiation hardening isolation process that required fewer steps and was less damaging to the device area. It is also desired to have a radiation hardening isolation process that reduces encroachment of field oxide and leaves a greater device area for forming devices on the substrate.

SUMMARY

The invention provides a method and a structure for isolating adjacent radiation hardened devices that overcomes the limitations of the prior art. With the invention, the device area is self-aligned to a layer of radiation hardening dielectric. Using the invention, the encroachment of the field oxide is very low, less than 0.3 µm per side of the device area.

The advantages of the invention are achieved by adding a layer of polysilicon as a buffer layer over the device area. The extra masking step of the prior art is eliminated by using a resist etch back planarization technique to remove the radiation hardening dielectric above the device area. The polysilicon remaining over the field oxidation acts as an etch stop for the resist etch back.

More specifically, the invention provides a method for fabricating radiation hardened integrated circuits and isolating one radiation hardened device from another. In its broader aspects the invention provides for depositing a layer of polysilicon over a semiconductor substrate including device areas. The polysilicon layer is patterned to cover the device areas. The patterning is accomplished by applying a layer of silicon nitride over the polysilicon layer and selectively removing the silicon nitride to leave portions of silicon nitride covering the polysilicon layer. Then the exposed polysilicon is removed by a standard etching technique to uncover areas of the substrate between adjacent devices. The uncovered substrate areas are then oxidized using a LOCOS process. The oxidation step creates a field oxide. However, as a result of the polysilicon layer over the device area, the field oxide does not encroach into the device area a significant amount.

As a next step, the silicon nitride is stripped from the polysilicon layer and the field oxide is removed using a wet or a dry etch that is selective between silicon and silicon dioxide. The field oxide removal is continued until the substrate areas between adjacent devices is exposed. Then the substrate is thermally oxidized to provide a relatively thin, dense layer of silicon dioxide. This layer of silicon dioxide will act as a diffusion barrier for contaminants that are contained in the radiation hardening dielectric. The substrate is then coated with a conformal layer of a radiation hardening dielectric such as PSG or BPSG. The substrate is next planarized by either a chemical process, a mechanical process or a combined chemical and mechanical process. During planarization, the layer of radiation hardening dielectric is removed until the polysilicon layer is exposed in order to form a planar surface with exposed polysilicon areas separated by radiation hardening dielectric. Next, a selective etch removes the polysilicon to expose the device areas. Subsequently, the device areas are further processed to form devices including transistors such as field effect transistors, bipolar transistors and other devices including diodes, capacitors, and inductors in the exposed device areas of the silicon. After forming the device areas, the integrated circuit is passivated and subsequently separated from the substrate and packaged into individual integrated circuits.

DETAILED DESCRIPTION

Figure 1:
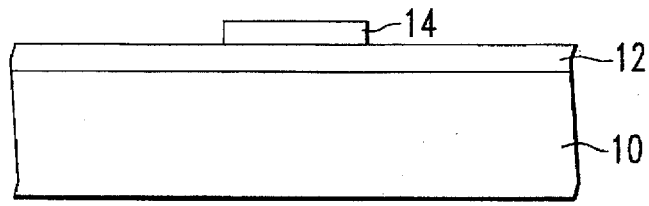
FIGS. 1–4 show sequential steps at a prior art process.
Figure 2:
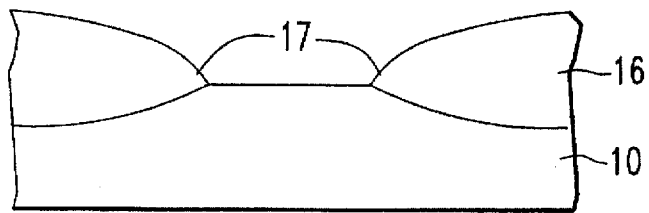
Figure 3:
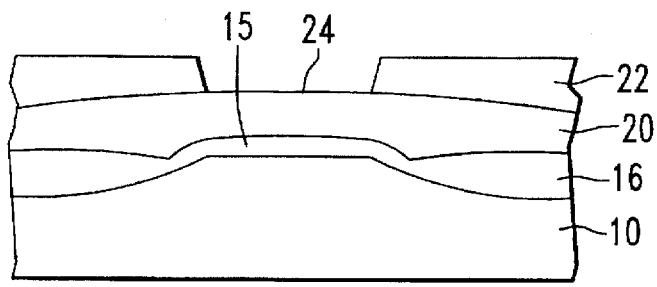
Figure 4:
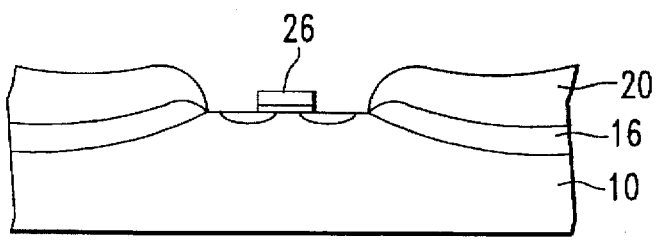

A typical prior art process is shown in FIGS. 1–4. A substrate 10 is covered with a layer 12 of silicon dioxide. A layer 14 of silicon nitride is deposited and patterned to cover future device areas. Subsequently a LOCOS operation is performed to create the field oxide 16. Field oxide 16 encroaches upon the device area by forming so-called birds beaks 17 that consume substrate in the intended device area. For this reason, the device areas have to be initially oversized in order to accommodate for LOCOS encroachment. The structure shown in FIG. 2 is subjected to a selective etch in order to reduce the thickness of the field oxide layer 16. A thin oxide 15 is grown on the exposed substrate areas and the substrate is covered with a layer 20 of radiation hardening dielectric. The layer 20 is then covered with a seal oxide layer 22. The seal oxide layer 22 is patterned to have openings 24 that generally correspond to the device area. Opening 24 is further processed to remove the exposed portions of layer 20 and the thin oxide 15 and thereby expose the substrate device areas. Device 26, typically a transistor, is formed in the exposed device area. Of course, other devices including bipolar transistors, capacitors, and inductors may be formed in the exposed device area.

Figure 5:
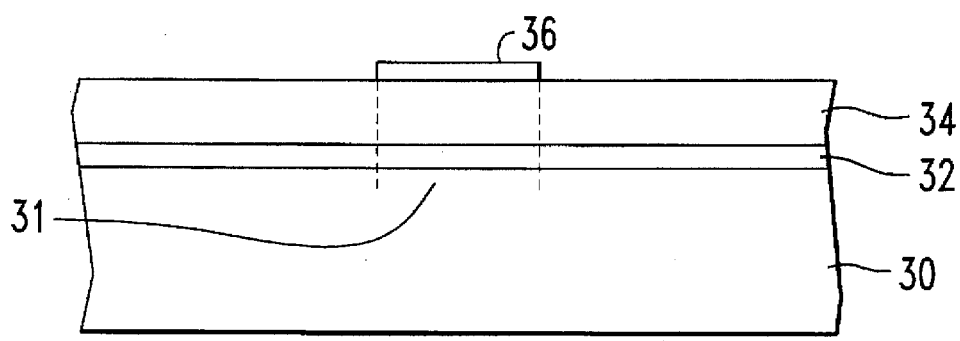
FIGS. 5–11 show sequential steps and forming an integrated circuit with radiation hardening isolation.
Figure 6:
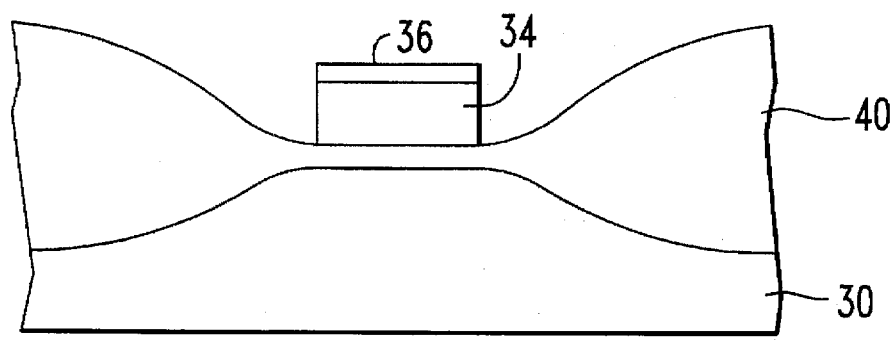

Turning to FIGS. 5–10, the method of the invention is shown in a series of sequential steps. With reference to FIG. 5, a substrate 30 typically comprises monocrystalline silicon. A pad oxide layer 32 is formed on the substrate 30. The pad oxide layer 32 is a relatively thin thermal oxide. The thickness of layer 32 is approximately 270–330 angstroms.

On pad oxide layer 32 there is deposited an initial layer of polysilicon layer 34. The polysilicon layer 34 is approximately 230 angstroms thick. On polysilicon layer 34 there is deposited a layer of silicon nitride 36. The silicon nitride layer is approximately 600 angstroms thick. The silicon nitride layer 36 is patterned with photoresist and suitable etching operation in order to form portions of silicon nitride over device areas 31. Using the remaining portion 36 of the silicon nitride layer as a mask, the exposed portions of polysilicon layer 34 are removed and a substrate 30 is subjected to a LOCOS process to grow field oxide 40. The field oxide 40 is approximately 8800 angstroms thick. This is a thermal oxide which has the ability to trap charges induced by ambient radiation. Accordingly, one of the steps of the radiation hardening process described herein will be to remove most of the field oxide 40.

Figure 7:
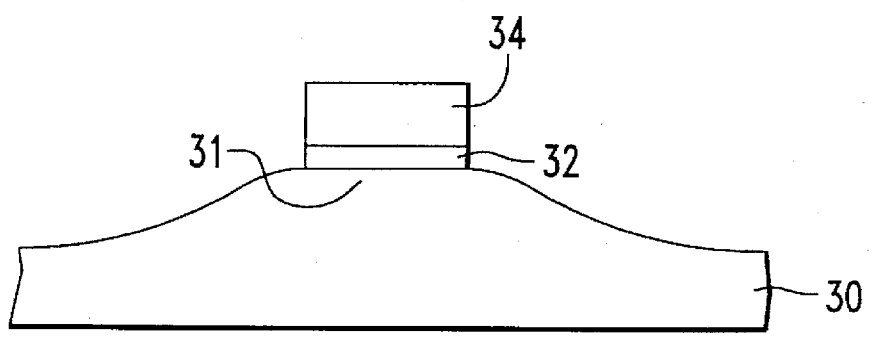
Figure 8:
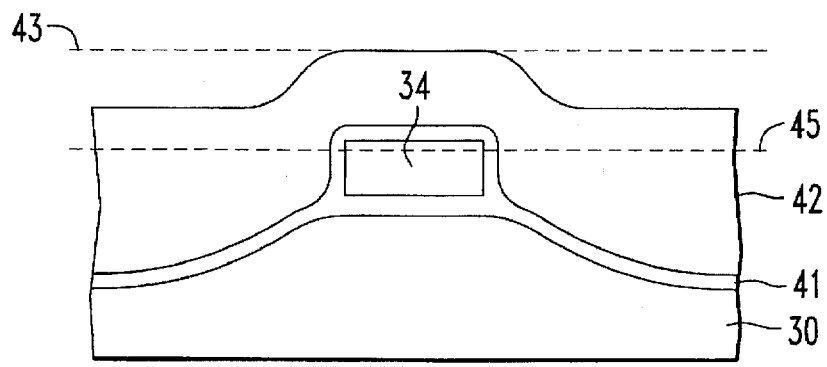
Figure 9:
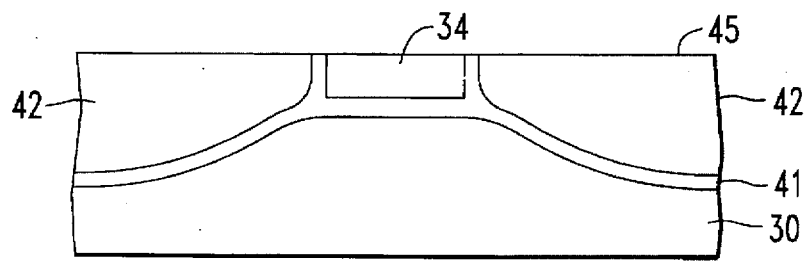

In a next step, the remaining nitride is stripped by a suitable enchant such as phosphoric acid. After nitride removal, the field oxide 40 is removed from the areas between devices with a wet oxide etch using the remaining polysilicon layer 34 as a mask. See in particular, FIG. 7. There it will be seen that the field oxide is removed and the substrate between adjacent device areas is exposed. The resulting structure shown in FIG. 7 is uniformly coated with a layer 41 of tub oxide (FIG. 8). The tub oxide is also a thermal oxide and is approximately 1,000 angstroms thick. The tub oxide will act as a diffusion barrier for the subsequent radiation hardening dielectric.

Figure 10:
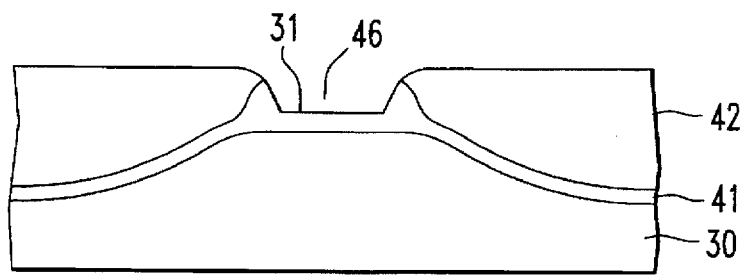
Figure 11:
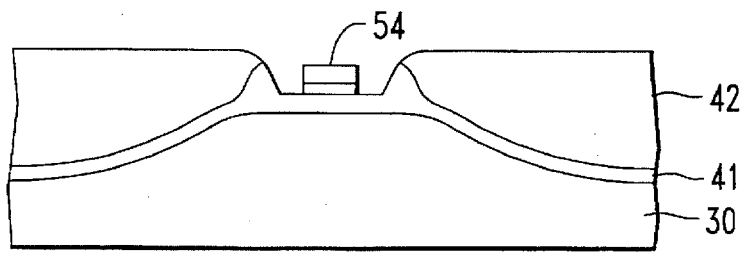

The radiation hardening dielectric 42 is uniformly deposited on the intermediate substrate as shown in FIG. 8. Next, photoresist is deposited over the radiation hardening layer 42 in order to establish a first common plane 43. The photoresist and radiation hardening dielectric 42 are then isotopically etched (planarized) in a suitable plasma dry etch down to the level of plane 45. The etching of the photoresist and the radiation hardening dielectric 42 is stopped when the polysilicon 34 is exposed to yield the intermediate structure shown in FIG. 9. After planarization, the polysilicon 34 is removed by a suitable polysilicon strip which includes a wet isotropic etch. A typical enchant is potassium hydroxide. With the polysilicon layer 34 removed, the structure shown in FIG. 10 provides exposed device areas 31 in an opening 46 in the radiation hardening dielectric 42. Thereafter, suitable devices such as FET 54 may be formed in areas 31. In addition to the formation of FET's, those skilled in the art will appreciate that they may also form bipolar transistors, capacitors, inductors, diodes, and other semiconductor and circuit devices. Those skilled in the art will also appreciate that the radiation hardening dielectric may comprise PSG or BPSG or other suitable radiation hardening dielectric devices.

The invention, as disclosed above, provides a device area 31 which has encroachment as low as 0.3 μm per side of the device area. In addition, the process shown above saves the step of forming a sealing oxide mask over the radiation hardening dielectric layer and etching that layer to expose the device area.

The invention has an additional advantage of using a planarization step. The planarization step results in a planar final structure. Such planar final structures provide smaller steps between the adjacent device area and the field oxide. For example, using the inventive method, the difference in height between the adjacent field isolation and the device area is as small as 500 angstroms. Such small differences are highly desirable and help maintain the gate oxide integrity for FET's formed in the device area. While the process described above is compatible with the typical metaloxide semiconductor process, other processes may be used including bipolar processing.

Those skilled in the art will appreciate that the disclosed process provides for a self-aligned device area 31. The device area 31 is self-aligned with adjacent field isolation region 42. The self-aligning technique eliminates the need to mask the layer 42 in order to expose the device areas 31. Instead, the invention provides for a substantially planar final structure shown in FIG. 9 in which the device area 31 can be readily accessed by simply etching away the polysilicon 34 that covers the device region 31.

Having thus described the preferred embodiment in the invention, those skilled in the art will appreciate that further modifications, changes and additions to the disclosed invention may be made without departing from the spirit and scope of the invention set forth in the attached claims.

What I claim is:

1. A method for fabricating a radiation hardened integrated circuits and isolating one radiation hardened device from other radiation hardened devices comprising the steps of:

depositing a layer of polysilicon over a semiconductor substrate;

patterning the layer of polysilicon to cover a device areas;

covering the polysilicon layer with a layer of radiation hardening dielectric;

planarizing the polysilicon and the radiation hardening dielectric to a common level;

removing the polysilicon to expose device areas self-aligned to the radiation hardening dielectric; and forming semiconductor devices in the exposed device areas.

2. The method of claim 1 wherein the radiation hardening dielectric is one selected from the group consisting of PSG and BPSG.

3. The method of claim 1 comprising the further steps of:

depositing a layer of silicon nitride over the layer of polysilicon;

patterning the deposited layer of silicon nitride to the device area;

removing polysilicon not covered by the remaining silicon nitride;

locally oxidizing the substrate regions adjacent the patterned polysilicon.

4. The method of claim 3 comprising the further steps of:

removing the remaining silicon nitride;

removing the local oxide layer not covered by polysilicon; and removing the polysilicon to expose substrate regions.

5. A method for fabricating a radiation hardened semiconductor device and isolating one radiation hardened device from other radiation hardened devices comprising the steps of:

depositing a layer of polysilicon over a semiconductor substrate;

covering the polysilicon layer with a first masking layer;

patterning the first masking layer to cover a device areas;

locally oxidizing the exposed substrate to form a field oxide between adjacent device areas;

removing the first masking layer over the polysilicon;

selectively removing the field oxide to expose the substrate outside the device areas;

covering the substrate with a layer of radiation hardening dielectric;

planarizing the polysilicon and the radiation hardening dielectric to a common level;

removing the polysilicon to expose device areas self-aligned to the radiation hardening dielectric; and forming semiconductor devices in the exposed device areas.

6. The method of claim 5 wherein the first masking layer is silicon nitride.

7. The method of claim 1 further comprising the step of depositing a pad oxide layer on the substrate before depositing the polysilicon.

8. The method of claim 5 wherein the field oxide is formed by thermal oxidation of the exposed substrate.

9. The method of claim 5 wherein the radiation hardening dielectric is one selected from the group consisting of PSG and BPSG.

10. The method of claim 5 comprising the further step of depositing a tub oxide over the exposed substrate and the polysilicon before depositing the radiation hardening dielectric.

* * * * *